(12) United States Patent
Wilby et al.

(10) Patent No.: US 11,913,109 B2
(45) Date of Patent: Feb. 27, 2024

(54) APPARATUS AND A METHOD OF CONTROLLING THICKNESS VARIATION IN A MATERIAL LAYER FORMED USING PHYSICAL VAPOUR DEPOSITION

(71) Applicant: SPTS Technologies Limited, Newport (GB)

(72) Inventors: Tony Wilby, Bristol (GB); Steve Burgess, Newport (GB); Adrian Thomas, Newport (GB); Rhonda Hyndman, Newport (GB); Scott Haymore, Newport (GB); Clive Widdicks, Newport (GB); Ian Moncrieff, Newport (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 95 days.

(21) Appl. No.: 16/541,635

(22) Filed: Aug. 15, 2019

(65) Prior Publication Data

US 2020/0090913 A1 Mar. 19, 2020

(30) Foreign Application Priority Data

Sep. 18, 2018 (GB) ..................................... 1815216

(51) Int. Cl.
*C23C 14/50* (2006.01)
*C23C 14/34* (2006.01)
(Continued)

(52) U.S. Cl.
CPC ............ *C23C 14/50* (2013.01); *C23C 14/345* (2013.01); *C23C 14/3485* (2013.01);
(Continued)

(58) Field of Classification Search
CPC .. H01J 37/345; H01J 37/3452; H01J 37/3405; H01J 37/3467; H01J 37/347;
(Continued)

(56) References Cited

U.S. PATENT DOCUMENTS

| | | | |
|---|---|---|---|
| 4,461,688 A * | 7/1984 | Morrison, Jr. | ........ H01J 37/347 204/192.12 |
| 5,082,542 A | 1/1992 | Moslehi et al. | |

(Continued)

FOREIGN PATENT DOCUMENTS

| | | |
|---|---|---|
| CN | 1341159 A | 3/2002 |
| CN | 106011761 A | 10/2016 |

(Continued)

OTHER PUBLICATIONS

'Cassette' definition. Merriam-Webster Online Dictionary [https://www.merriam-webster.com/dictionary/cassette].*

(Continued)

*Primary Examiner* — Michael A Band
(74) *Attorney, Agent, or Firm* — Hodgson Russ LLP

(57) ABSTRACT

A magnet assembly is disclosed for steering ions used in the formation of a material layer upon a substrate during a pulsed DC physical vapour deposition process. Apparatus and methods are also disclosed incorporating the assembly for controlling thickness variation in a material layer formed via pulsed DC physical vapour deposition. The magnet assembly comprises a magnetic field generating arrangement for generating a magnetic field proximate the substrate and means for rotating the ion steering magnetic field generating arrangement about an axis of rotation, relative to the substrate. The magnetic field generating arrangement comprises a plurality of magnets configured to an array which extends around the axis of rotation, wherein the array of magnets are configured to generate a varying magnetic (Continued)

field strength along a radial direction relative to the axis of rotation.

6 Claims, 8 Drawing Sheets

(51) Int. Cl.
    *C23C 14/35* (2006.01)
    *C23C 14/54* (2006.01)
    *H01J 37/32* (2006.01)
    *H01J 37/34* (2006.01)
(52) U.S. Cl.
    CPC ............ *C23C 14/35* (2013.01); *C23C 14/351* (2013.01); *C23C 14/505* (2013.01); *H01J 37/32715* (2013.01); *H01J 37/3405* (2013.01); *H01J 37/3452* (2013.01); *H01J 37/3455* (2013.01); *H01J 37/3467* (2013.01); *C23C 14/542* (2013.01)
(58) Field of Classification Search
    CPC ............ H01J 37/3266; H01J 37/32422; H01J 37/32669; H01J 37/32715; H01J 37/3402; C23C 14/35; C23C 14/351; C23C 14/542; C23C 14/3485; C23C 14/345; C23C 14/50; C23C 14/505; H01F 2003/103
    See application file for complete search history.

(56) References Cited

U.S. PATENT DOCUMENTS

| | | | |
|---|---|---|---|
| 5,795,451 A | 8/1998 | Tan et al. | |
| 6,143,140 A * | 11/2000 | Wang | C23C 14/046 204/192.12 |
| 6,258,217 B1 | 7/2001 | Richards et al. | |
| 6,462,482 B1 * | 10/2002 | Wickramanayaka | C23C 14/35 118/723 E |
| 9,347,129 B2 * | 5/2016 | Foo | H01F 7/0284 |
| 2003/0146084 A1 | 8/2003 | Fu | |
| 2013/0081938 A1 | 4/2013 | Mizuno et al. | |
| 2013/0101749 A1 * | 4/2013 | Yang | H01J 37/3405 427/523 |
| 2013/0146453 A1 | 6/2013 | Foo | |
| 2013/0186743 A1 | 7/2013 | Mizuno | |
| 2013/0319855 A1 | 12/2013 | Li | |

FOREIGN PATENT DOCUMENTS

| | | | |
|---|---|---|---|
| EP | 3392370 A1 | | 10/2018 |
| JP | 6187868 A | * | 5/1986 |
| JP | S61124133 A | | 6/1986 |
| JP | 2000017435 A | * | 1/2000 |
| JP | 2001140071 A | | 5/2001 |
| JP | 2015509138 A | | 3/2015 |
| JP | 2016509134 A | | 3/2016 |

OTHER PUBLICATIONS

Machine Translation JP 6187868 A (Year: 1986).*
Japanese Abstract JP 6187868 A (Year: 1986).*
EPO, ESR for EP19187850, dated Feb. 12, 2020.
TIPO, Office Action for TW Application No. 108126807, dated Jun. 6, 2023.
JPO, Office Action for JP Application No. 2019-169176, dated Oct. 12, 2023.

* cited by examiner

APPARATUS AND A METHOD OF CONTROLLING THICKNESS VARIATION IN A MATERIAL LAYER FORMED USING PHYSICAL VAPOUR DEPOSITION

BACKGROUND

The present invention also relates to an apparatus and method of controlling thickness variation in a material layer formed via pulsed DC physical vapour deposition.

Bulk acoustic wave (BAW) devices are used in mobile phones and other wireless applications to allow a specific radio frequency to be received and/or transmitted. These devices utilise a piezoelectric effect to generate a mechanical resonance from an electrical input and conversely a mechanical resonance can be used to generate an electrical output.

The BAW devices typically comprise a number of material layers that are deposited and patterned on a silicon (Si) substrate using standard semiconductor thin film processing techniques. Physical Vapour Deposition (PVD) is commonly used to deposit both the top and bottom metal electrodes and the piezoelectric dielectric layer (e.g. AlN or AlScN).

Factors that determine the performance of the manufactured device include the electrical, mechanical, physical and acoustic properties of the piezoelectric material. In a manufacturing environment, the process is ordinarily controlled by monitoring film thickness and film stress. A very precisely controlled film thickness, good thickness uniformity and good within wafer stress uniformity will result in a high yield of functional devices per wafer and a good coupling coefficient, which is typically defined as the mechanical energy accumulated within the device in response to an electrical input, or vice versa.

One of the major causes of yield loss in BAW manufacturing is frequency shift. The operating frequency of a BAW filter is determined by the thickness of the piezoelectric layer as this determines the resonant frequency. Assuming constant acoustic velocity and density the thickness accuracy and uniformity requirement of the piezoelectric layer needs to be in the order of 0.1%. However, this degree of within wafer uniformity is not achievable during the deposition process, so it is standard within the industry to correct film thickness after deposition by selectively trimming areas of the wafer with a localised etch process. Usually, an ion beam that produces a constant etch rate is scanned along the surface of the wafer with a controlled speed so that it will remove the correct amount of material at each location.

The full width half-maximum (FWHM) of the ion beam is typically a few centimetres and the scan pattern typically has a line to line distance in the millimetre range. The ion beam diameter is small enough to correct the thickness gradients that typically occur over a range of a few centimetres. The local removal rate is controlled by the time the ion beam stays at a certain position on the wafer and the required velocity profile or scan speed of the beam across the wafer is calculated from the thickness map of the deposited film.

The trimming process may be challenging if local short range thickness variations (SRTV) are present. A narrow beam must be used and the accelerations required to accommodate the necessary velocity profile can make trimming difficult. The scan speed limitation can be circumvented by lowering the ion beam etch rate, but then the throughput of the system will be affected and the device cost is increased.

Magnetic fields can be used at the wafer surface during deposition to give control of the sputtered film stress. Such a magnetic field can be generated using a continuously rotating array of permanent magnets embedded in the platen that supports the wafer during deposition process.

An example of a magnetic array which is used to control within wafer stress during the deposition of AlN and AlScN piezoelectric layers is shown in FIG. 1. FIG. 1 illustrates a spiral array of button magnets 1 while the modelled magnetic field components for the continuously rotated array are shown in FIG. 2. Magnetic arrays have been demonstrated to provide a uniform stress within the wafer and a uniform film thickness across the wafer, compared with films deposited using standard techniques. However, although the overall thickness uniformity of the deposited film is low, <2% full range typically, there is a short range thickness variation that corresponds to the short range ripple of the averaged magnetic field components, as illustrated in FIG. 2.

Referring to FIG. 3 of the drawings, there is illustrated a plot of the thickness (Å) of a deposited film across the diameter of a 200 mm wafer. The plot shows that the spiral array (illustrated in FIG. 1) generates a variation in the thickness of the deposited layer of approximately 150 Å for a nominal 10000 Å deposition thickness of AlScN. FIG. 4 provides a magnified view of the variation in film thickness over a 3 mm distance and upon referring to FIG. 4, it is evident that the SRTV comprises approximately 75 Å. To achieve acceptable device performance the thickness of the piezoelectric layer needs to be controlled to within ±0.1% (i.e. ±10 Å for a 10000 Å film).

SUMMARY

We have now devised a magnetic field assembly, apparatus and method which address at least some of the above mentioned problems.

In accordance with the present invention, as seen from a first aspect, there is provided a magnet assembly for steering ions used in the formation of a material layer upon a substrate during a pulsed DC physical vapour deposition process, the assembly comprising: a magnetic field generating arrangement for generating a magnetic field proximate the substrate, means for rotating the ion steering magnetic field generating arrangement about an axis of rotation, relative to the substrate, wherein the magnetic field generating arrangement comprises a plurality of magnets configured to an array which extends around the axis of rotation, and wherein the array of magnets are configured to generate a varying magnetic field strength along a radial direction relative to the axis of rotation.

In an embodiment, the array comprises two linear, sub-arrays which extend along a radial direction relative to the axis of rotation, the two sub-arrays being angularly separated around the axis of rotation by substantially 180°.

In a further embodiment, the array may comprise at least three linear, sub-arrays which extend along a radial direction relative to the axis of rotation, the at least three sub-arrays being angularly separated around the axis of rotation. The at least three sub-arrays may be angularly separated around the axis of rotation by substantially the same angle.

In an embodiment, the array comprises a plurality of linear sub-arrays arranged in a parallel configuration. In an alternative embodiment, the array comprises a spiral array centred on the axis of rotation. In yet a further alternative, the array may comprises a plurality of concentric, substantially circular sub-arrays, centred on the axis of rotation.

In an embodiment, at least two magnets of the array are arranged in a stacked configuration. For example, the array may comprise a first row of magnets and a second row of magnets disposed above the first row.

In an embodiment, the plurality of magnets are disposed within a cassette, which may be substantially disk-shaped, and which comprises at least one recess adapted to receive the plurality of magnets.

In an embodiment, the magnets within the recess are configured to a first and second array, the second array being disposed above upon the first array.

In an embodiment, the at least one recess comprises a first and second recess portion which extend along a radial direction relative to the axis of rotation, the two recess portions being angularly separated around the axis of rotation by substantially 180°. Alternatively, the cassette may comprises at least three recesses which extend along a radial direction relative to the axis of rotation, the at least three recesses being angularly separated around the axis of rotation. In an embodiment, the at least three recesses are angularly separated around the axis of rotation by substantially the same angle.

In a further embodiment, the array comprises a plurality of linear recesses arranged in a parallel configuration, which extend substantially parallel with a diameter of the cassette. The linear recesses may extend to a periphery of the cassette.

In an embodiment, the recess comprises a spiral recess centred on the axis of rotation. In an alternative embodiment, the recess comprises a plurality of concentric, substantially circular recesses, centred on the axis of rotation.

In an embodiment, the assembly further comprises at least one spacer for spacing the magnets within the recess.

In an embodiment, the means for rotating the magnetic field comprises a spindle and a drive assembly for driving the spindle, the spindle being rotationally coupled at one end with the cassette and at the other end with the drive assembly.

In an embodiment, the north-south axes of the magnets of the array extend substantially parallel to each other, and preferably substantially perpendicular to the substrate in use.

In an embodiment, the material layer formed upon the substrate comprises a piezoelectric layer, such as a layer formed of AlN or AlScN.

In accordance with the present invention, as seen from a second aspect, there is provided apparatus for controlling thickness variation in a material layer formed via pulsed DC physical vapour deposition, the apparatus comprising: a chamber for housing a target from which the material layer is formed, and a substrate upon which the material layer is formable, the chamber comprising an inlet for introducing a gas into the chamber; a plasma generating arrangement for generating a plasma within the chamber; and, a voltage source for applying an RF bias voltage to the substrate; wherein the apparatus further comprises a plasma localising magnetic field generating arrangement configured to in use generate a plasma localising magnetic field proximate the target for localising the plasma adjacent the target; and, a magnet assembly according to the first aspect.

In an embodiment, the magnetic field generated by the magnet assembly is substantially unaffected by the plasma localising magnetic field.

In an embodiment, the magnetic field generating arrangement is disposed at a side of the substrate which is opposite a side of the substrate facing the plasma.

In accordance with the present invention, as seen from a third aspect, there is provided a method of controlling thickness variation in a material layer formed via pulsed DC physical vapour deposition, the method comprising the steps of:

providing a chamber comprising a target from which the material layer is formed and a substrate upon which the material layer is formable;

disposing a substrate upon a magnet assembly according to the first aspect;

introducing a gas into the chamber;

generating a plasma within the chamber;

applying a plasma localising magnetic field proximate the target to substantially localise the plasma adjacent the target;

applying an RF bias voltage to the substrate;

applying the magnetic field of the magnet assembly proximate the substrate to steer gas ions from the plasma to selective regions upon the material layer formed on the substrate to improve thickness uniformity of the material layer when compared to the absence of the magnetic field;

rotating the magnetic field of the magnet assembly about the axis of rotation, relative to the substrate.

In an embodiment, the radially variable magnetic field strength is greater proximate a periphery of the substrate than a centre of the substrate.

In an embodiment, the method further comprises rotating the magnetic field relative to the substrate as the material layer is formed.

In an embodiment, the method comprises rotating the magnetic field, such as by rotating the magnet assembly, about an axis which extends substantially perpendicular to the substrate.

In an embodiment, the method further comprises a plurality of separate deposition steps for forming the material layer, wherein the substrate is rotated relative to the assembly prior to commencing each deposition step.

Whilst the invention has been described above, it extends to any inventive combination of features set out above or in the following description. Although illustrative embodiments of the invention are described in detail herein with reference to the accompanying drawings, it is to be understood that the invention is not limited to these precise embodiments.

Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

BRIEF DESCRIPTION OF THE DRAWINGS

The invention may be performed in various ways, and, by way of example only, embodiments thereof will now be described, reference being made to the accompanying drawings in which.

DETAILED DESCRIPTION OF EMBODIMENTS

The present invention will now be described in detail. It has been found that the embodiments of the present invention enable a significant reduction in the short range ripple of the averaged ion steering magnetic field components while still providing a sufficiently strong time averaged ion steering magnetic field to provide good within wafer stress control.

Figure 5:
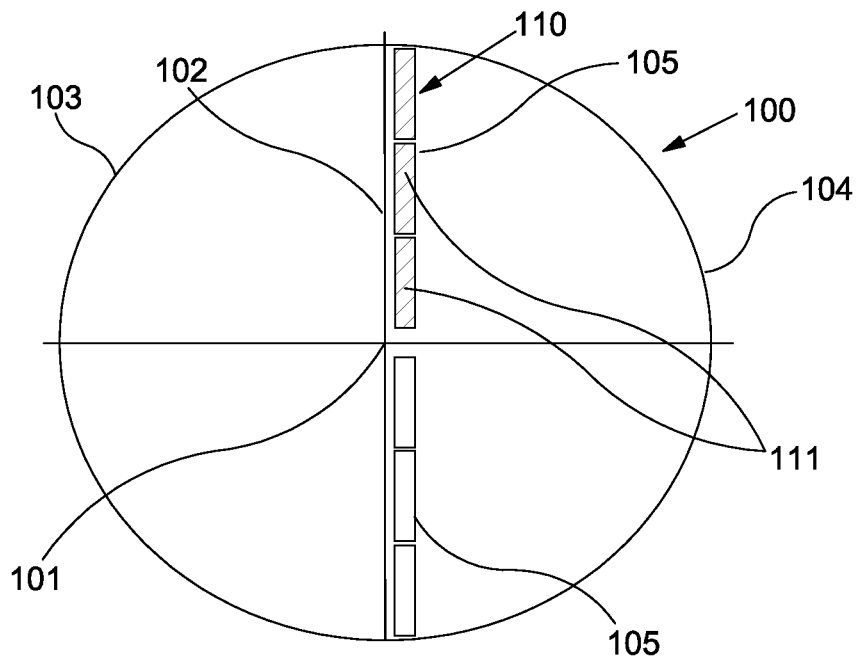
FIG. 5 is a schematic representation of a magnet assembly according to an embodiment of the present invention, with a linear array of magnets.
Figure 6:
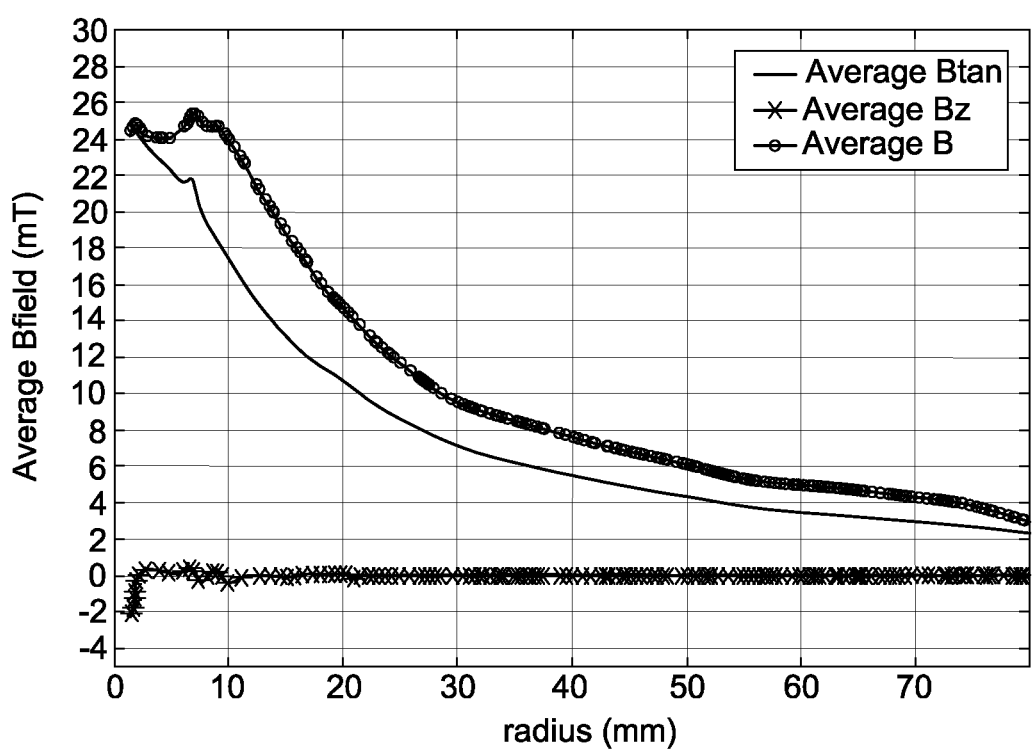
FIG. 6 is a graphical representation of magnetic field components generated during a rotation of the array illustrated in FIG. 5.

Referring to FIG. 5 of the drawings, there is illustrated a magnet assembly 100 according to an embodiment of the present invention, which is used to control the thickness variation of a material layer, such as AlScN piezoelectric layer, deposited upon a substrate 230 (see FIG. 15 of the drawings) using a physical vapour deposition (PVD) process, such as pulsed DC PVD. The assembly 100 comprises a magnetic field generating arrangement 110 for generating, in use, a magnetic field proximate the substrate 230. The magnetic field generating arrangement 110 comprises a plurality of magnets 111 configured to an array 110 in which the plurality of magnets 111 are placed around an axis 101 of rotation (out of the page in FIG. 9; see also FIG. 15) of the assembly 100 relative to the substrate 230, such that, in use, the magnetic field varies along a radius 102 between the axis of rotation 101 and a periphery 103 of the arrangement 110.

Figure 7:
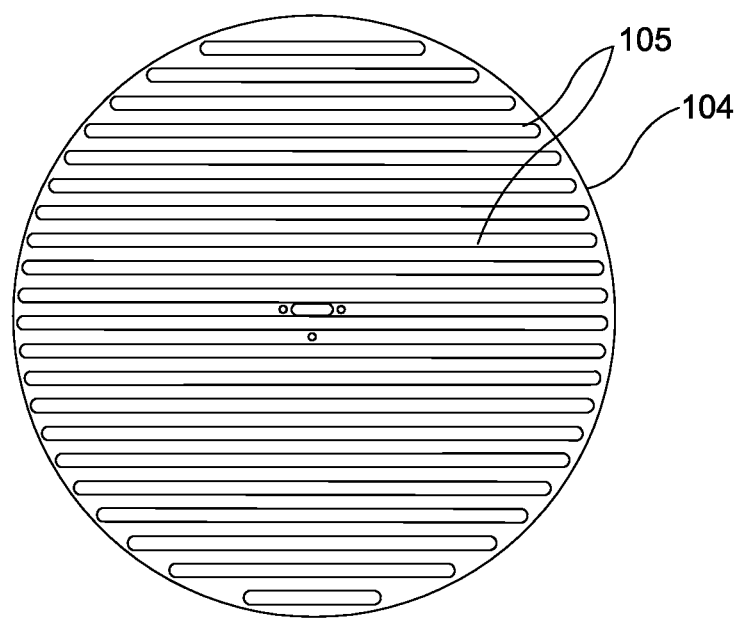
FIG. 7 is a schematic representation of a magnet assembly according to an embodiment of the present invention, comprising an array of magnets configured to a parallel array of linear rows.

The plurality of magnets 111 are disposed within a cassette 104, which is substantially disk-shaped and which comprises at least one recess 105 adapted to receive the magnets 111 of the array 110. In a first embodiment, as illustrated in FIG. 5 of the drawings, the cassette 104 comprises a single recess 105 having a first and second recess portion which extend along a diameter of the cassette 104, one recess portion being disposed either side of a central portion of the cassette 104. In a second embodiment, as illustrated in FIG. 7 of the drawings, the cassette 104 may comprise a plurality of recesses 105, arranged in a parallel arrangement, which extend parallel with a diameter of the cassette (FIG. 7). In this embodiment, the recesses extend along chords of the cassette, and each recess extends to a periphery of the cassette 104.

Figure 8:
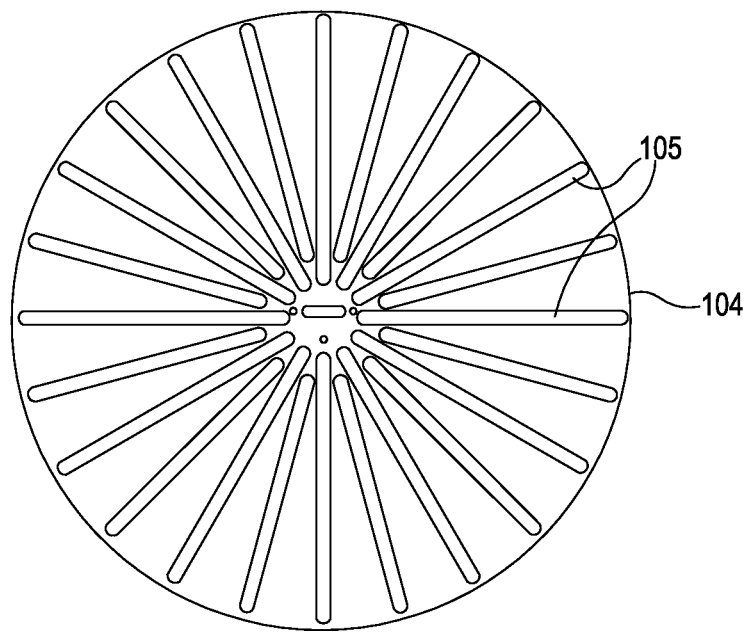
FIG. 8 is a schematic representation of a magnet assembly according to an embodiment of the present invention, comprising an array of magnets configured to plurality of angularly separated, radially extending rows.

In a third embodiment, as illustrated in FIG. 8 of the drawings, the cassette 104 may comprise a plurality of radially extending recesses 105 with each recess being angularly separated around the cassette. The angular separation may be equal or the angular separation may be tailored to steer ions to suit a particular deposition process.

In the embodiments illustrated in FIGS. 5, 7 and 8, the magnets 111 may comprise a cuboidal shape and/or a bar-shape, and the magnets are removably insertable within the recesses 105 so that a specific sequence of magnets 111 can be created along the respective recess, to create the desired variation in magnetic field strength along the radial direction relative to the axis of rotation 101. The magnets 111 used typically comprise a magnetic field strength of the order of milliteslas (mT) and the magnetic field profile generated along a radius of the cassette 104 may be tailored by suitably positioning the magnets 111. For example, magnets 111 with different field strengths may be suitably located and spaced from each other if required using non-magnetic spacers 106.

The assembly 100 further comprises means 120 (see FIG. 15 of the drawings) for rotating the magnetic field generating arrangement 110 about an axis 101 of rotation, relative to the substrate 230. The means 120 for rotating the magnetic field may comprise a spindle (not shown) rotationally coupled at one end with the cassette 104, and at the other end with a drive assembly (not shown).

The magnets 111 disposed in each recess 105 may comprise different field strengths to create a variation in the field profile along a radial direction. However, it is envisaged that this variation may also be realised using magnets 111 having the same field strength but located a different heights relative to a surface of the cassette 104 using spacers 106, to effectively space the magnets 111 from the substrate 230 and thus tailor the field strength experienced by the substrate at that radial position. Moreover, it is envisaged that the recess 105 may comprise a depth which enables two or more magnets 111 to be stacked on top of each other (without extending above a surface of the cassette 104). In this respect, it is envisaged that each recess 105 may comprise two or more rows of a sequence of magnets 111 and spacers 106, the rows being disposed one above the other. Accordingly, different radial positions of the substrate 230 may experience a field strength resulting from two stacked magnets, a magnet positioned lower in the recess or near the surface of the cassette, or substantially no field by positioning a stacked arrangement of spacers 106 at the radial position. The different options for configuring the magnets 111 and spacers 106 within each recess 105 facilitates the creation of a number of bespoke radial field profiles for steering ions.

Figure 9:
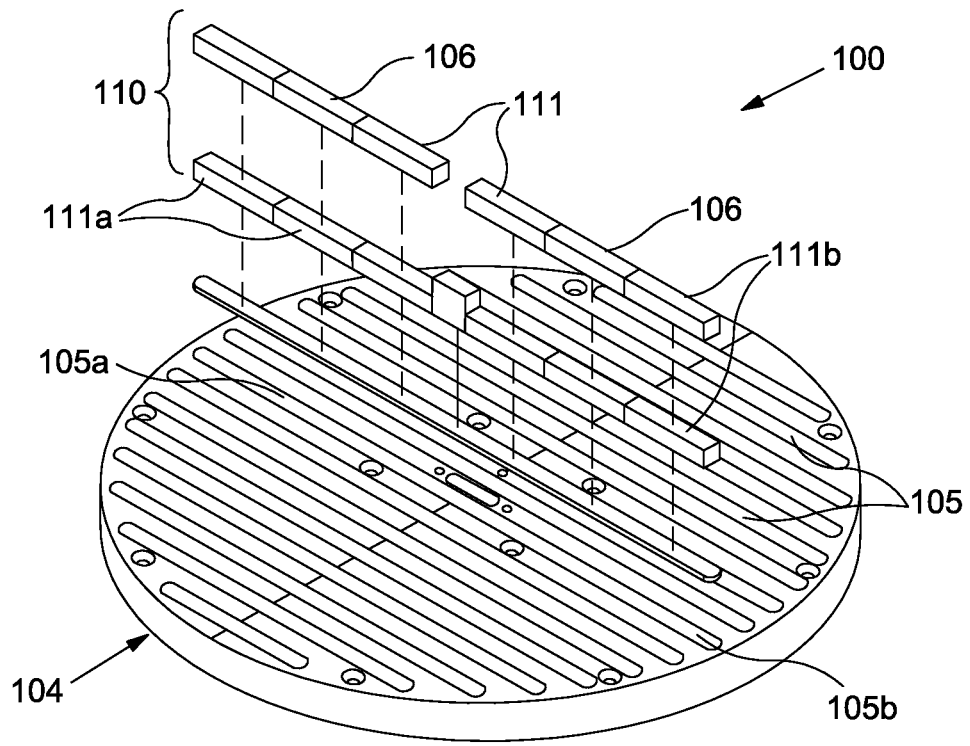
FIG. 9 is a schematic representation of the magnet assembly illustrated in FIG. 5, comprising a stacked configuration of magnets.
Figure 10:
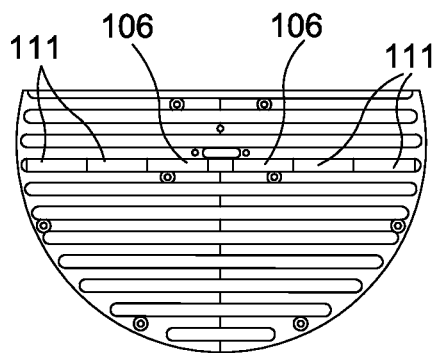
FIG. 10 is a plan view of a first layer of the stacked magnets within the array of FIG. 9.
Figure 11:
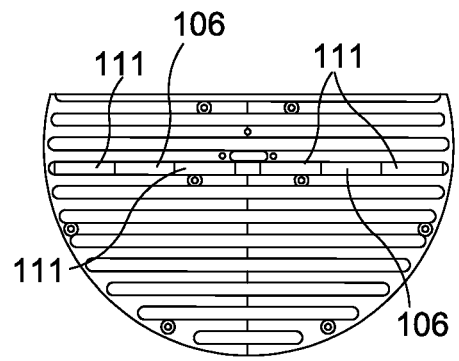
FIG. 11 is a plan view of a second layer of the stacked magnets within the array of FIG. 9.

Referring to FIGS. 9-11 for example, which illustrate the assembly of the first embodiment, the plurality of magnets 111 may comprise a first row or layer 111a of magnets 111 and spacers arranged in a recess 105 which extends along a diameter of the cassette 104, and a second row or layer of 111b of magnets 111 and spacers 106 which extend above the first row within the same recess 105. Upon referring to FIG. 9 it is clear that the field strength at the ends of the recess 105a,b, namely near a periphery of the cassette 104, will be greater than at the centre owing to the stacked arrangement of two magnets 111 at each end 105a,b, compared with a stacked arrangement of magnet 111 and spacer 106 at the centre. The north-south axes of the magnets 111 of the array 110 may extend substantially parallel to each other and, in use, substantially perpendicular to the substrate 230. The time averaged magnetic field achieved using the embodiments of the present invention is of sufficient strength at all points to control the within wafer stress uniformity to typically ±50 MPa.

The normal stress profile of aluminium nitride or aluminium scandium nitride piezoelectric layer is significantly more tensile at the centre of the wafer than at the edge. The invention described herein produces a highly uniform stress profile in the deposited film via the creation of the ion steering magnetic field that is stronger in the region where the film or material layer is most compressive i.e. the strongest field is required at the edge of the wafer.

Figure 1:
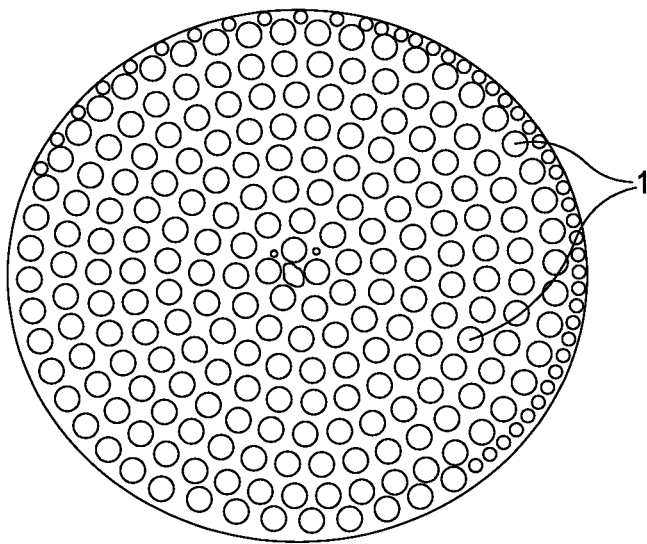
FIG. 1 is schematic representation of a spiral array of button magnets, not forming part of the present invention.
Figure 2:
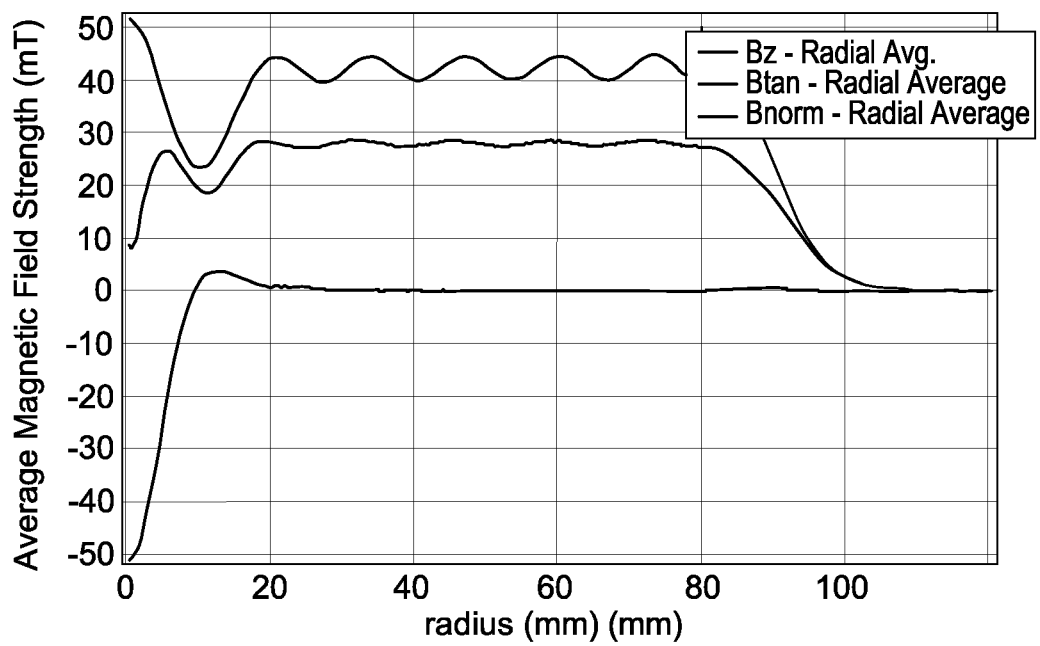
FIG. 2 is a graphical representation of magnetic field components generated during a rotation of the array illustrated in FIG. 1.
Figure 3:
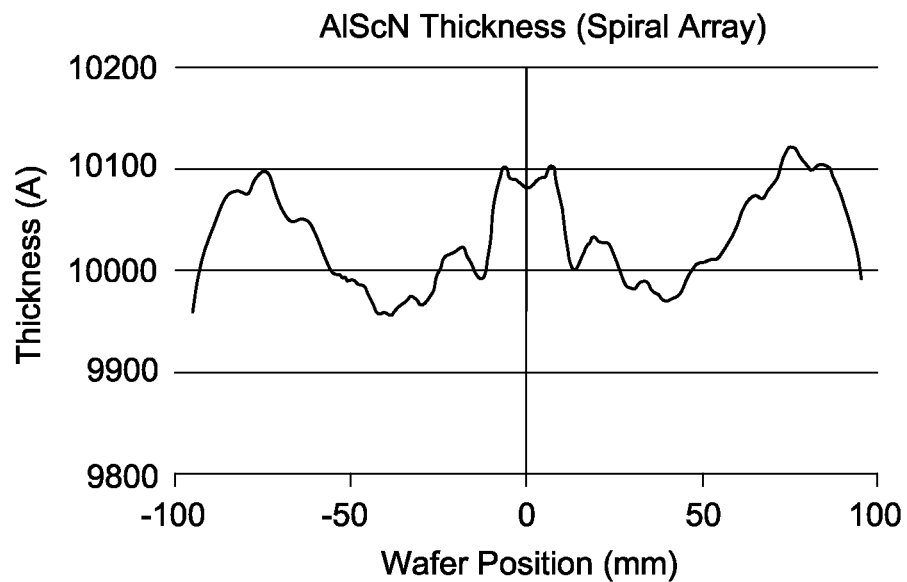
FIG. 3 is a graphical representation of a thickness profile of AlScN piezoelectric layer achieved using a "spiral" type array of magnets, across the complete diameter of a 200 mm wafer.
Figure 4:
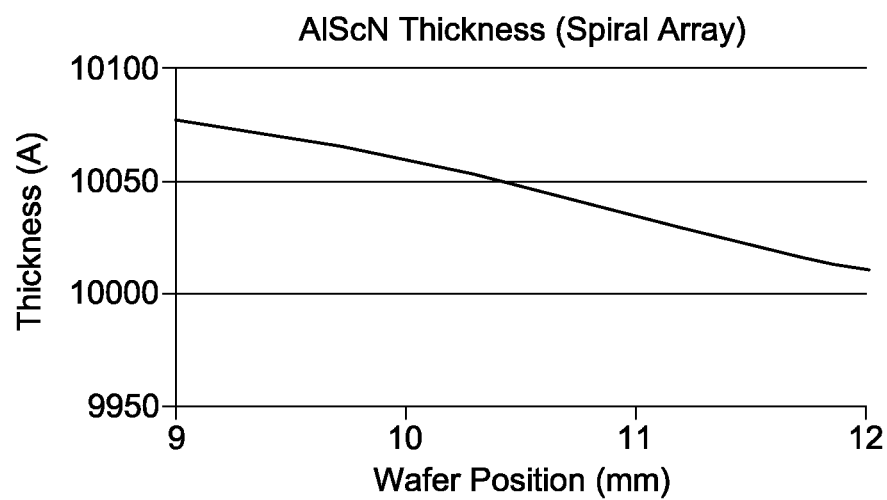
FIG. 4 is a graphical representation of a thickness profile of AlScN piezoelectric layer illustrated in FIG. 3, over a 3 mm range of the wafer.
Figure 12:
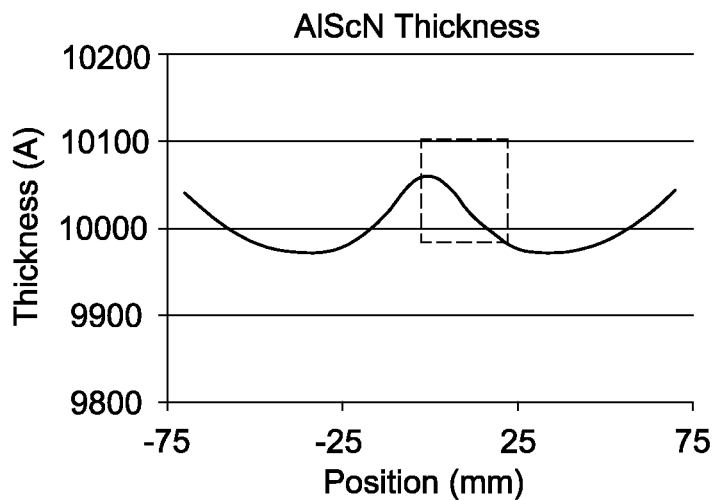
FIG. 12 is a graphical representation of a thickness profile of AlScN piezoelectric layer achieved using the magnet assembly illustrated in FIG. 9.
Figure 13:
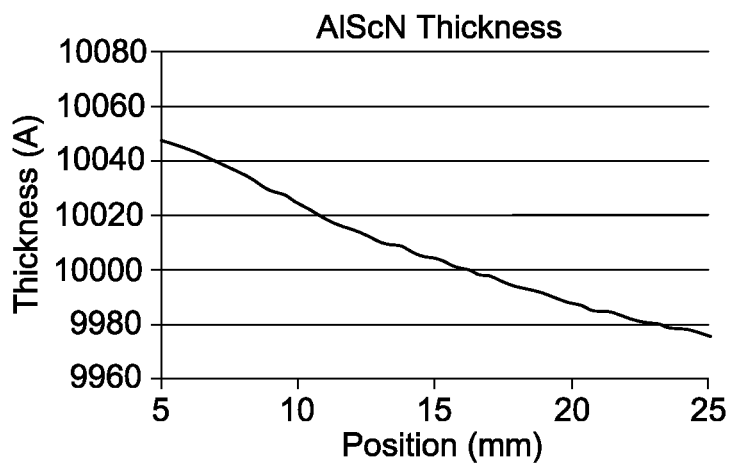
FIG. 13 is a graphical representation of a thickness profile of the AlScN piezoelectric layer illustrated in FIG. 12, taken across a 20 mm range of the layer.
Figure 14:
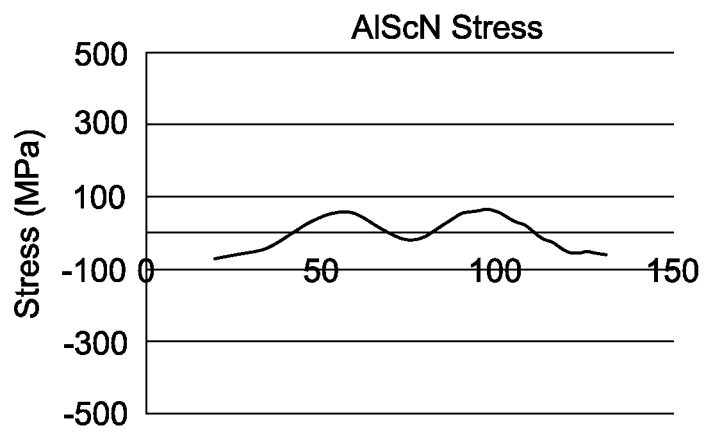
FIG. 14 is a graphical representation of a stress profile across the deposited AlScN layer, using the magnet assembly illustrated in FIG. 9.

It is important to minimise interactions between the magnetic fields of adjacent magnets 111 so that the time averaged magnetic field generates a smooth variation when rotated. The thickness and stress profile of an AlScN film deposited using an ion steering assembly according to an embodiment of the present invention with a plurality of magnets configured to a linear array (such as that illustrated in FIGS. 9-11), is illustrated in FIGS. 12-14. The graphs of FIGS. 12 and 13 shows that the radially varying magnetic field of the array generates a much lower rate of change in thickness than that shown in FIGS. 3 and 4, with FIG. 13 being the thickness range over a 20 mm portion of FIG. 12. In FIG. 13 the thickness of the piezoelectric layer is controlled to within ±0.1% (i.e. ±10 Å for a 10000 Å film) over a 3 mm scan. The SRTV is significantly reduced compared with the results illustrated in FIG. 4 and as such, the film thickness is much easier to correct by ion beam trimming if necessary.

FIG. 14 illustrates the stress profile (MPa) across the centre of a wafer comprising an AlScN layer deposited using the assembly illustrated in FIG. 9. The stress variation within the wafer is ±50 MPa, which is comparable with the existing designs. The rate of change in thickness across the wafer is much lower than the rate of change of thickness which can be achieved using existing technologies.

Figure 15:
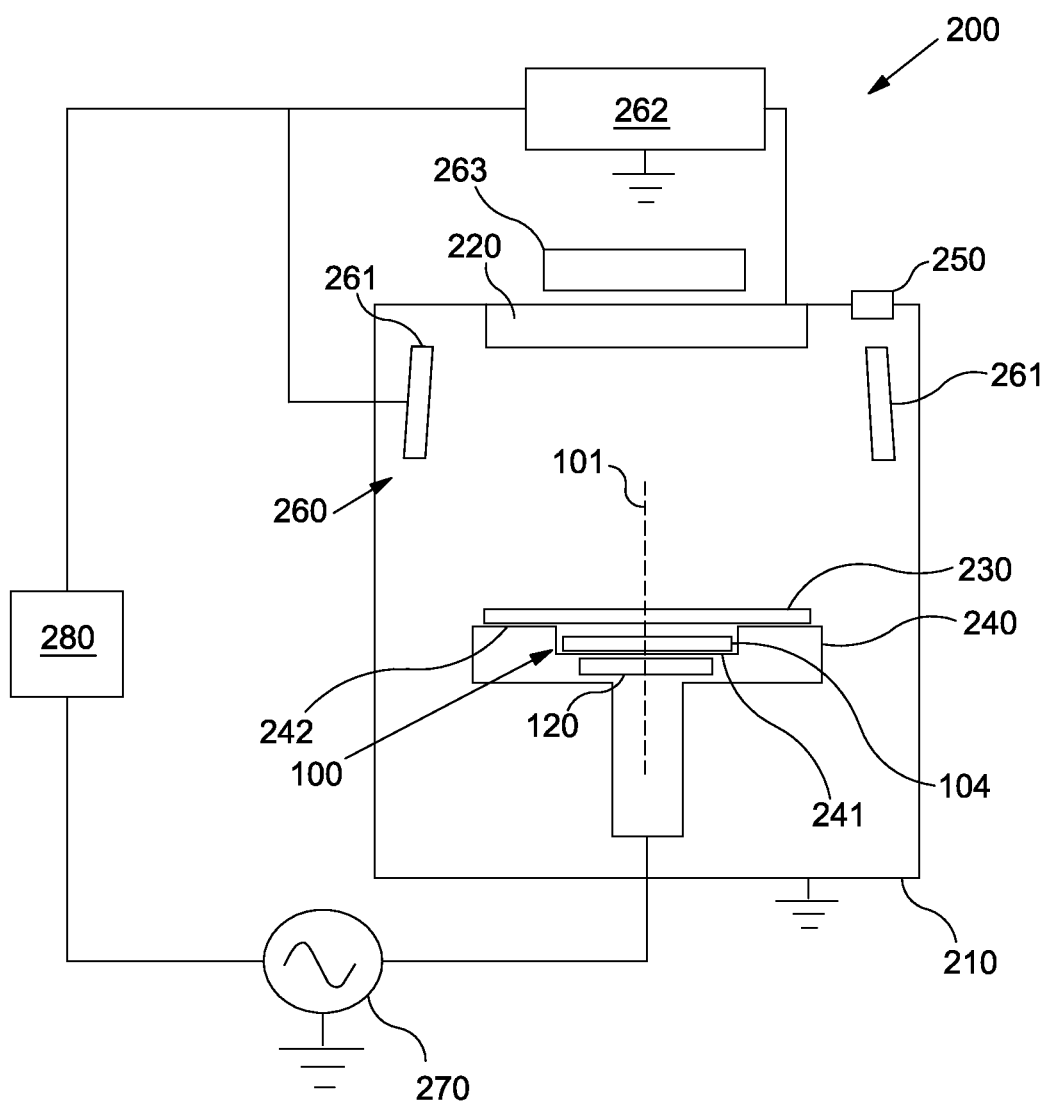
FIG. 15 is a schematic illustration of an apparatus according to an embodiment of the present invention.

Referring to FIG. 15 of the drawings, there is illustrated a schematic representation of an apparatus 200 according to an embodiment of the present invention, for controlling thickness variation in a material layer formed via pulsed DC physical vapour deposition. The apparatus 200 comprises an electrically grounded processing chamber 210 within which the physical vapour deposition process takes place. The chamber 210 is adapted to house a target 220, such as aluminium or aluminium scandium nitride, from which the material layer is sputtered and a platen 240 upon which the substrate 230, such as a silicon wafer, is supported. The chamber 210 further comprises an inlet 250 for introducing a gas into the chamber, such as a noble gas krypton, neon or argon, for example and a reactive gas such as nitrogen to form a nitride film.

The apparatus 200 further comprises a magnet assembly 100 which may be disposed within a recess 241 of the platen 240. The platen 240 is located and orientated within the chamber 210 such that the wafer 230 is positionable in a substantially parallel orientation with the target 220 upon a platen surface 242, and such that the wafer axis 101 which extends through a centre of the wafer, substantially perpendicular thereto, is substantially aligned with a target axis which extends substantially perpendicular to a plane of the target 220. However, in an alternative embodiment, it is envisaged that the platen 240 and wafer 230 may be tilted relative to the target 220, and the wafer axis 101 may be misaligned relative to the target axis. The apparatus 200 further comprises a plasma generating arrangement 260 for generating plasma within the chamber 210 and a voltage source 270 for applying an RF bias voltage to the substrate 230 via the platen 240. Typically, the platen 240 is driven at 13.56 MHz out of convention, although the invention is not limited in this regard.

The plasma may be generated by applying pulsed (direct current) DC power between the target 220 and an anode ring 261 disposed within the chamber 210, from a DC power supply 262. The operation of the power supplies 261, 270 is controlled with a controller 280 having a suitable graphical user interface (not shown). The plasma localising magnetic field generating arrangement, such as a magnetron 263, is configured to, in use, generate a plasma localising magnetic field proximate the target 220 for localising the plasma adjacent the target 220. The magnetron 263 is disposed outside of the chamber 210, at the side of the target 220 which is opposite the side facing the substrate 230, and is arranged to rotate around an axis which extends substantially transverse to the target 220. The magnet assembly 100 is disposed at the side of the substrate which is opposite the side facing the target 220, and the magnetic field 100 extends to a few centimetres above the substrate. There is no significant interaction between the magnetic field from the magnetron 290 near the target 220 and the magnetic assembly 100 behind the substrate 230. The plasma localising magnetic field strength is typically reduced to background levels proximate the substrate 230, and as such that the ions which drift proximate the substrate become influenced principally, if not solely, by the magnetic field from the magnet assembly 100.

Figure 16:
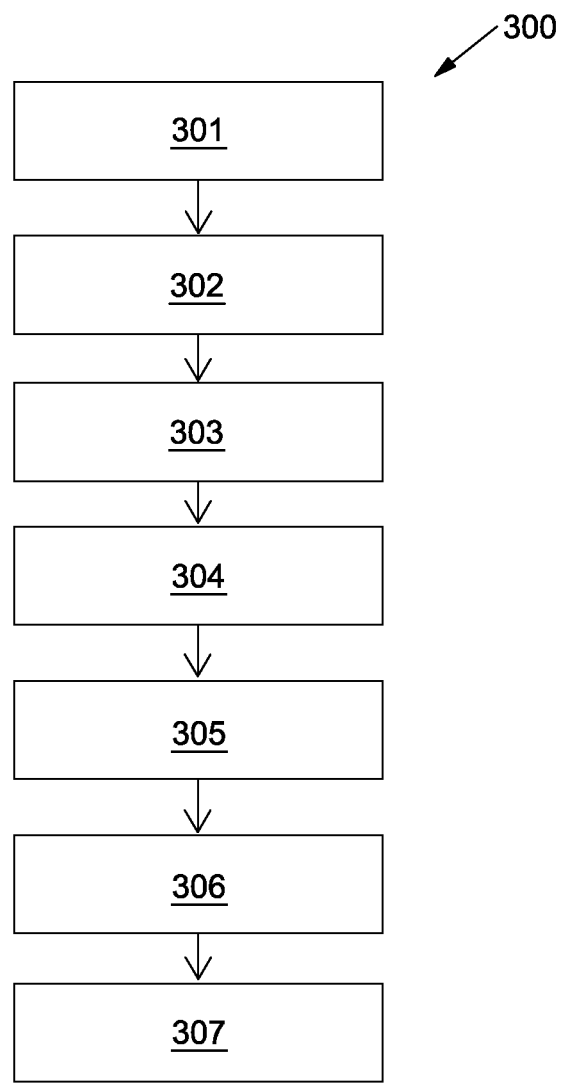
FIG. 16 is a flow chart illustrating steps of a method according to an embodiment of the present invention.

Referring to FIG. 16 of the drawings, there is illustrated a flow chart which outlines the steps associated with a method 300 of controlling thickness variation in a material layer formed via pulsed DC physical vapour deposition, according to an embodiment of the present invention. When it is desired to form a material layer, such as aluminium nitride or aluminium scandium nitride layer, upon a substrate 230, such as a silicon wafer, the magnet assembly 100 comprising the cassette 104 and magnetic array 110 is placed within the platen at step 301, and the wafer 230 is placed upon the platen over the array 110 at step 302. The aluminium target 220 is also disposed within the chamber 210 at step 303 and a gas (not shown), which may comprise nitrogen or argon or a nitrogen/argon mixture is introduced into the chamber 110 at step 304 via the inlet 250.

The method 300 may further comprise tuning the magnetic field at step 305, by manipulating the magnets 111 and spacers 106, so as to tailor the radial magnetic filed profile. The method further comprises rotating the cassette 104 at step 306, relative to the wafer 230, to provide for a non-uniform ion steering magnetic (B) field across the surface of the wafer 230. In particular, the radially varying magnetic field may be stronger proximate a periphery of the substrate than at a centre. The step 306 of rotating the ion steering magnetic field relative to the substrate may be executed as the material layer is formed and takes place about an axis which extends substantially perpendicular to the substrate 230. The method 300 may further comprise a plurality of deposition steps for forming the material layer, wherein the substrate 230 is rotated relative to the ion steering assembly 100 prior to commencing each step.

The magnetron 263 generates a magnetic field proximate the target 220 for localising the plasma and thus the gas ions around the target 220. This localisation encourages the interaction of the gas ions within the target 220 and thus facilitates the release of aluminium atoms therefrom.

At step 307, an RF bias is applied to wafer 230 by RF power supply. This electrical bias results in an electric field which is directed substantially perpendicular to the wafer surface and results in the positively charged gas ions becoming attracted toward the wafer 230 (during one half cycle of the RF voltage waveform). The ions strike the surface of the wafer 230 and thus compact the deposited layer of aluminium atoms, which results in a more compressed layer. The ion density striking the wafer 230 varies across the wafer 230 owing to a variation in the ions generated within the plasma. The plasma profile is dependent on the magnetic field from the magnetron and regions of high magnetic field create concentrated regions of plasma and thus gas ions. It is found that magnetrons used in physical vapour deposition processes generate regions of high ion density proximate a peripheral region of the target 230 which thus results in an increased release (namely erosion) of target material from the periphery thereof compared with a central region. Moreover, this increased ion density results in a more concentrated bombardment of ions upon the wafer 230 around a peripheral region thereof compared with the central region.

However, the interaction of the RF bias voltage and the ion steering magnetic field of the array 110 generates a force, namely the Lorentz force, on the moving gas ions. The force is dependent on the cross-product of the electric field generated by the RF bias, and the ion steering magnetic field from the array 110. This force thus acts to preferentially re-direct or steer the ions onto regions of the wafer 230, resulting in an increase in ion density at these regions on the layer.

Embodiments of the present invention enable the production of a piezoelectric layer with a thickness profile that will give improved economy of manufacture and device performance. Furthermore, ion beam thickness trimming can be performed with a wide ion beam, wide line-to-line distance and low scan accelerations/decelerations, which results in a fast and low-cost trimming process.

The invention claimed is:

1. A magnet assembly within a platen that supports a substrate for steering ions used in formation of a material layer upon the substrate during a pulsed DC physical vapour deposition process, the magnet assembly configured to be disposed within a recess of the platen, the magnet assembly comprising:
    a magnetic field generating arrangement for generating a magnetic field proximate and below the substrate,
    means for rotating the magnetic field generating arrangement about an axis of rotation, relative to the substrate, wherein the magnetic field generating arrangement comprises a plurality of magnets configured to an array which extends around the axis of rotation, wherein the array of magnets are configured to generate a varying magnetic field strength along a radial direction relative to the axis of rotation, and wherein the array comprises a plurality of linear sub-arrays arranged in a parallel configuration and a stacked configuration,
    a cassette, wherein the plurality of magnets are disposed within the cassette having a plurality of recesses adapted to receive the linear sub-arrays, wherein the recesses are defined in an outer surface of the cassette, wherein the substrate is disposed above the cassette, wherein the linear sub-arrays extend parallel with a diameter of the cassette, wherein the magnets within the recesses are configured in the stacked configuration, wherein the array of magnets with the stacked configuration is configured such that the varying magnetic field strength is greater proximate a periphery of the recesses in the cassette than a centre of the cassette, wherein at least one of the recesses has a first and second recess portion on either side of the centre of the cassette, wherein at least two of the recesses extend from one end of the periphery to the other end of the periphery, and wherein all the recesses are parallel to each other, and
    at least one non-magnetic spacer for spacing the magnets within at least one of the recesses.

2. The magnet assembly according to claim 1, wherein the means for rotating the magnetic field comprises a spindle and a drive assembly for driving the spindle, the spindle being rotationally coupled at one end with the cassette and at the other end with the drive assembly.

3. An apparatus for controlling thickness variation in the material layer formed via pulsed DC physical vapour deposition, the apparatus comprising:
    a chamber for housing a target from which the material layer is formed, and the substrate upon which the material layer is formable, the chamber comprising an inlet for introducing a gas into the chamber;
    a plasma generating arrangement for generating a plasma within the chamber; and,
    a voltage source for applying an RF bias voltage to the substrate;
    wherein the apparatus further comprises a plasma localising magnetic field generating arrangement configured to generate a plasma localising magnetic field proximate the target for localising the plasma adjacent the target; and,
    the magnet assembly according to claim 1.

4. Apparatus according to claim 3, wherein the magnetic field is substantially unaffected by the plasma localising magnetic field.

5. Apparatus according to claim 3, wherein the magnetic field generating arrangement is disposed at a side of the substrate which is opposite a side of the substrate facing the plasma.

6. The magnet assembly according to claim 1, wherein the linear sub-arrays are separated from each other by portions of the cassette.

* * * * *